United States Patent [19]
Coccio

[11] 3,862,439
[45] Jan. 21, 1975

[54] ZERO CROSSOVER SWITCHING CIRCUIT

[75] Inventor: Ernest F. Coccio, Conshohocken, Pa.

[73] Assignee: Athena Controls, Inc., West Conshohocken, Pa.

[22] Filed: Nov. 19, 1973

[21] Appl. No.: 417,066

[52] U.S. Cl......... 307/252 UA, 307/252 F, 307/261, 323/225 C
[51] Int. Cl........................................... H03k 17/72
[58] Field of Search......... 307/252 F, 252 UA, 261, 307/133; 323/225 C

[56] References Cited

UNITED STATES PATENTS

| | | | |
|---|---|---|---|
| 3,569,999 | 3/1971 | Pascente | 307/252 UA |
| 3,577,010 | 5/1971 | Freyling, Jr. | 307/252 UA |
| 3,702,435 | 11/1972 | Endo et al. | 323/225 C |

*Primary Examiner*—John Zazworsky
*Attorney, Agent, or Firm*—William E. Cleaver

[57] ABSTRACT

The present circuit includes a full wave rectifier connected to receive an a.c. signal from a signal source and to provide pulsating d.c. to a switching network. The rectifier is connected at its output to first and second voltage storage means and a three element electronic switching device. The first voltage storage means acts to change the polarity of the voltage on the second storage means so that said electronic switching means gets turned on in response to a zero crossover of the applied a.c. signal.

4 Claims, 5 Drawing Figures

ZERO CROSSOVER SWITCHING CIRCUIT

BACKGROUND

When switching circuits are used to rapidly turn on or turn off circuits, which are controlled thereby, these switching circuits generate a radio frequency signal which is undesirable. For instance, in the technique of controlling or monitoring heat generators it has often been the practice to employ triacs or silicon controlled rectifiers which can be turned on rapidly to energize a relay or another switching circuit or even to provide the power to the heating element itself. In accordance with these techniques, it has been reasoned that if the triacs or the silicon controlled rectifiers (or the other electronic switching devices) could be turned on at the time that the line power signal is going through its zero value point then there would be a reduction in the surge of energy and there would be a resulting reduction in the radio frequency signal disturbance. As a practical matter triacs and silicon control rectifiers cannot be turned on at the zero voltage point since the holding current in such devices is also zero. However, there have been attempts in the prior art to switch such circuits as near to the zero crossover as possible. In such prior art "zero voltage switching circuits" there is a delay circuit usually employed which acts so that the pulse which actually fires the electronic switching device causes that device to fire sometime shortly after the zero crossover. In this approach the timing of the firing pulse is quite critical and normally has required a substantial number of components to generate a carefully defined delay.

In at least one other approach to providing a zero cross-over switching arrangement, the circuit has generated a gate pulse or a long pulse which starts before the zero crossing and continues sometime thereafter. In this second approach, energy is wasted by having the firing pulse occur before the zero crossover and normally large inductances have been necessary to effect some isolation.

SUMMARY

The present circuit employs substantially fewer circuit elements than the prior art circuits described above. The present circuit, in the preferred embodiment, employs either a programmed unijunction transistor or a silicon controlled rectifier as the electronic switching element. Depending upon the configuration of the circuitry, any one of the elements; i.e., the gate, the anode, the cathode can be the control element. The larger of two capacitors, which are employed, is connected to fix the voltage of the element which is not being toggled or having the control signal applied thereto, while the smaller of two capacitors, which are employed, is connected to provide a voltage polarity bias to the switching circuit so that the control element will bias the circuit to conduct immediately after the line voltage passes through the zero value.

The objects and features of the present invention will be better understood when the description hereinafter is studied in conjunction with the drawings wherein.

Figure 1:
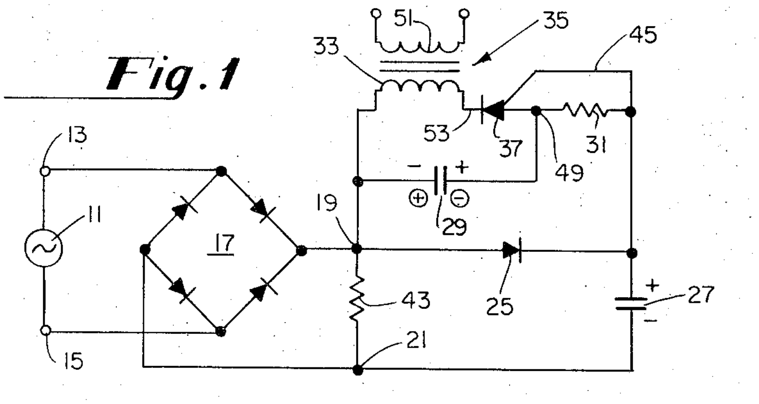
FIG. 1 depicts one embodiment of the present invention.

Consider FIG. 1 wherein there is shown a source of a.c. signal 11 connected to two terminals 13 and 15. Terminals 13 and 15 are connected to the input terminals of the full wave rectifier 17. The output of the full wave rectifier 17 is applied to the terminals 19 and 21 and is depicted as pulsating d.c. current shown by a graphic waveform in FIG. 5.

If we consider that there are no voltages developed anywhere in the circuit and that the output from the full wave rectifier 17 is the signal, in the first quadrant of the wave 23, we then have current flow from terminal 19 through the diode 25 to charge the capacitor 27 as shown by the plus and minus signals thereon. There also is current flow from the terminal 19, through the capacitor 29, through the resistor 31, through the capacitor 27, to the terminal 21. This last current flow causes the capacitor 29 to be charged as shown by the plus-minus signs which have been encircled. The charge on capacitor 29 is very small because of the voltage drop across diode 29 on the forward direction. There is no current flow through the primary winding 33 of the pulse transformer 35 because such current flow is blocked by the programmed unijunction transistor 37.

Now when the line voltage passes through the point 39 (of FIG. 5) and starts into the second quadrant 41, the capacitor 29 commences to discharge through the diode 25 and resistor 31 while the capacitor 27 also commences to discharge through the resistor 31 to charge up the capacitor 29 in accordance with the plus-minus signs shown and which have not been encircled. It should be understood that the capacitor 27 is many times larger than the capacitor 29. The resistor 31 and capacitor 29 provide an RC time constant and the values are chosen such that the capacitor 29 is substantially charged prior to the rectified voltage 41 reaching the zero level 43.

Accordingly, then when the line power, fully rectified, reaches the zero value 43, the circuit will be such that the voltage drop across the capacitor 29 will be substantially equal to the voltage drop across the capacitor 27 and the voltage at the gate terminal 45 of the programmed unijunction transistor 37 will be fixed by the voltage across the capacitor 27.

Now when the line power, having been fully rectified, starts into the third quadrant 47 (at zero crossover time) the voltage on the anode 49 will be the voltage drop across the capacitor 29, only at this time it is measured from a positive potential at terminal 19 and hence will be more positive than the voltage on the gate 45. Therefore the programmed unijunction transistor will be turned on immediately. By causing the programmed unijunction transistor 37 to conduct at a value very slightly higher than the zero crossover value, the programmed unijunction transistor is able to generate a sharply defined pulse immediately after the applied signal passes through the zero voltage. This sharply defined pulse can be used to turn on larger solid state devices with dramatically reduced noise because this turning on is effected at zero crossover. For instance when the programmed unijunction transistor 37 conducts there is current through the primary 33 of the pulse transformer 55 and hence there is a pulse output on the secondary 51 which can be used to turn on the other devices.

It should also be understood that when the programmed unijunction transistor 37 conducts, the capacitor 29 will discharge through the programmed unijunction transistor for a short period of time until the primary winding develops a positive potential on the cathode 53 which will terminate the conduction of the programmed unijunction transistor. Accordingly, there may be many pulses generated during the third quadrant time depending upon the choice of the values of the capacitor 29 and the inductance 33. The plurality of pulses may be advantageous if the response of the switching element does not occur at zero voltage but at some finite time later (but close to zero). For instance different SCR's have different holding currents.

Figure 2:
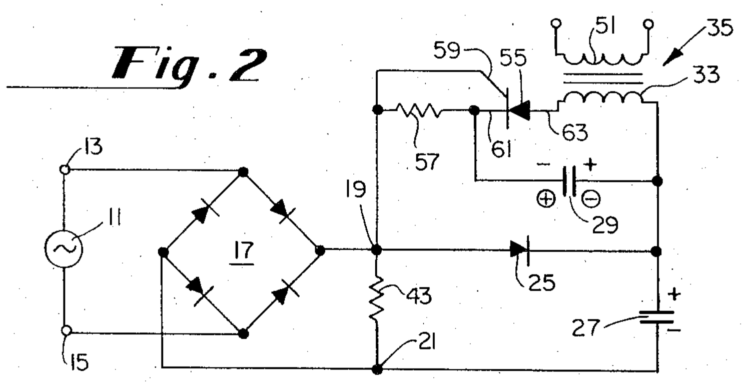
FIG. 2 depicts a second embodiment of the present invention.
Figure 5:
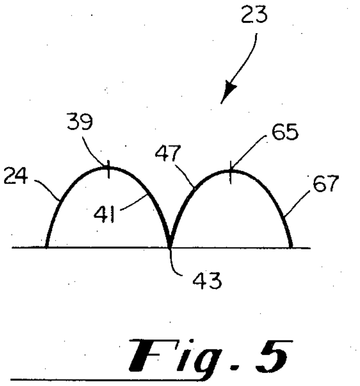
FIG. 5 shows the waveform across terminals 19 and 21 of each of the embodiments.

In FIG. 2, the a.c. power source 11 is shown connected to the same terminals 13 and 15 which in turn are connected to the same full wave rectifier 17. In addition the output of the full wave rectifier is connected to the same terminals 19 and 21 and the circuitry thereafter differs somewhat. In the circuitry of FIG. 2 a silicon controlled rectifier 55 is employed as the electronic switching means instead of the programmed unijunction transistor 37 shown in FIG. 1. The small capacitor 29 and the large capacitor 27 as well as the diode 25 are employed in virtually the same roles as discussed above. The pulse transformer 35 is employed as the output device. Let us consider the description of the circuit in conjunction with the full wave rectifier signal shown in FIG. 5. Again consider that no voltages have been developed and that the line signal with full wave rectification is in the first quadrant 24 (FIG. 5). At that time there is a positive signal at terminal 19 which causes current flow through the diode 25 to charge the large capacitor 27 as shown by the plus-minus signals thereon. At the same time current conducts through the resistor 57, through the capacitor 29, and through the capacitor 27, to charge the smaller capacitor 29 as shown by the plus-minus symbols which have been encircled. As mentioned above in the description of the circuit in FIG. 1, the voltage developed on capacitor 29 is very small, in the order of 1 volt, because of the small voltage drop in the forward direction across the diode 25. There is no current flow through the primary winding 33 because such current flow is blocked by the silicon controlled rectifier 55. After the line signal, fully rectified, passes through the point 39 (FIG. 5) and is in the second quadrant 41, the capacitor 29 discharges through the resistor 57 and through the diode 25. Simultaneously the capacitor 27 discharges, through the capacitor 29, through resistor 57 and the resistor 43 to charge the capacitor 29 as shown by the plus-minus signals which are not encircled. As before there is an RC time constant developed by the resistor 57 and the capacitor 29 and the values of the capacitor 29 and the resistor 57 are chosen such that the capacitor 29 is substantially charged before the rectified line signal reaches the zero point 43 (FIG. 5).

Now immediately as the fully rectified line signal goes into the third quadrant 47 there is a positive signal applied to the terminal 19 which is applied to the gate element 59. Because of the voltage across the capacitor 29, the positive signal applied to gate element 59 will be sufficiently positive to cause the silicon controlled rectifier 55 to conduct and the capacitor 29 will discharge while the primary winding 33 will develop a negative voltage on the anode 63 which will cut off the conduction through the silicon controlled rectifier 55. When the SCR 55 conducts it provides a signal through the primary winding 33 which induces an output signal in secondary winding 51. Thereafter while the fully rectified line voltage is in the third quadrant the capacitor 29 and 27 will be charged up as described originally.

After the fully rectified signal passes through the point 65 and it starts into the negative quadrant 67, the capacitor 27 will discharge to charge up the capacitor 29 as shown by the positive and negative signs which have not been encircled and the system will be ready for the next positive quadrant to cause the silicon controlled rectifier 55 to fire immediately after the fully rectified line signal passes through its zero point.

Figure 3:
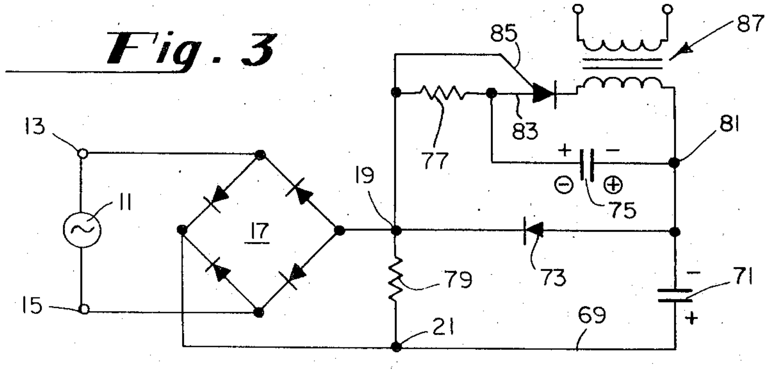
FIG. 3 depicts a third embodiment of the present invention.

FIG. 3 shows the same a.c. source signal 11 as well as the terminals 13 and 15, the full wave rectifier 17 and the output terminals 19 and 21. In FIG. 3 the full wave rectifier 17 has been reversed so that the elements of the circuit are connected with the opposite polarities from that shown in FIGS. 1 and 2. In FIG. 3 the line 69 will be the reference that is experiencing the positive and negative voltage swing. If we consider that the fully rectified line signal is in the first quadrant 24 then as the point 21 goes positive, the capacitor 71 is charged, as shown by the plus and minus signs, through the rectifier 73. At the same time the smaller capacitor 75 is charged to a very low value, because of the forward drop of diode 73, (as shown by the plus and minus signs which are encircled). The current path engaged in charging capacitor 75 is through the resistor 77 back to the terminal 19.

After the fully rectified line signal passes through the point 39 (FIG. 5) it starts into the second quadrant 41. This signal is going negative and hence the capacitor 71 attempts to discharge through the resistor 79, through the resistor 77 and through the capacitor 75, to charge capacitor 75 as shown by the plus-minus signs which have not been encircled. As before, the resistor 77 and the capacitor 75 are chosen so that the RC time constant enables the capacitor 75 to be substantially charged before the fully rectified line signal reaches the zero value 43.

Now when the line signal enters the quadrant 47 (FIG. 5) there will be positive potential applied to the point 21. Hence the voltage drop across the capacitor 71 will be measured from a slightly positive potential and the voltage at the point 81 will be somewhat more positive than it was the instant before the voltage began to rise at point 21. It follows then that the voltage across the capacitor 75 will be measured from a somewhat more positive potential and it follows that the positive potential bias between the anode 83 and the gate 85 will be sufficient to turn on the programmed unijunction transistor and thus provide current to the pulse transformer 87 to provide an output as described earlier.

Figure 4:
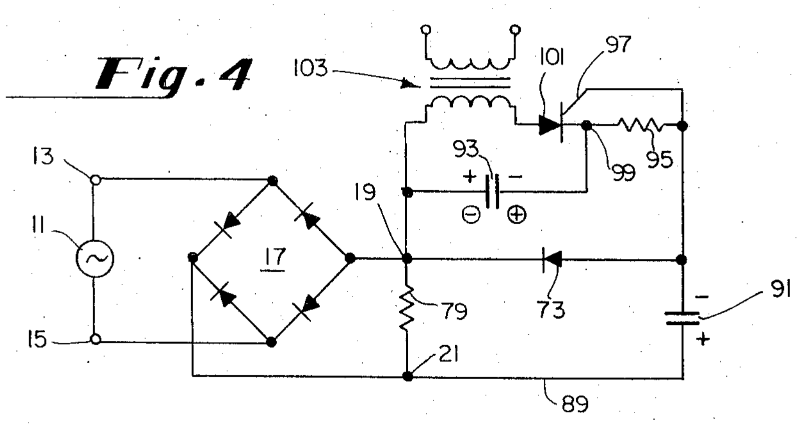
FIG. 4 depicts a fourth embodiment of the present invention.

The embodiment of the invention shown in FIG. 4 is similar to the embodiments described above excepting that there is a silicon controlled rectified employed as the electronic switching means and the four way rectifier 17 has been poled in the opposite direction so that the line 89 is the reference line which experiences the positive and negative swing in this circuit.

When the line signal rectified as shown in FIG. 5 is in the first quadrant 24 the larger capacitor 91 is charged as shown while the smaller capacitor 93 is charged to a small value because of the forward drop of diode 73, (as shown with the encircled plus and minus signs).

When the applied signal enters into the second quadrant 41, the capacitor 91 discharges through the resistor 79, through the capacitor 93, through the resistor 95, to charge the capacitor 93 as shown by the plus and minus signs which have not been encircled. It should be borne in mind that the resistor 95 and capacitor 93 are chosen such that they have values which will enable the capacitor 93 to be substantially charged before the line voltage gets to the zero crossover value 43 as shown in FIG. 5.

Thereafter when the line voltage centers into the third quadrant 47, the gate voltage on gate 97 will be more positive with respect to the cathode voltage on cathode 99 than it was at the instant before the line voltage started to become positive and hence at that instant in time, the silicon controlled rectifier 101 will be turned on to provide a plus output through the pulse transformer 103 as described earlier.

The present invention enables the switching circuit to switch at the zero crossover but employs far fewer circuit elements than have been employed in the prior art zero crossover switching circuits. This is made possible by the interplay between the larger capacitor and the smaller capacitor employed in the circuit. The larger capacitor always acting to recharge the smaller capacitor so that its polarity is changed in such a way that when the succeeding quadrant of the line voltage changes polarity the electronic switching device will be turned on immediately in response to the change in polarity trend of the line voltage.

I claim:

1. A zero crossover switching circuit comprising in combination: alternating current signal rectifying means adapted to be connected to an alternating current signal source, said alternating current signal having cycles which pass through a zero value; electronic signal switching means having an input element, an output element and a control element; first voltage storage means; first circuitry means connecting said first voltage storage means across said input element and said output element of said electronic signal switching means; second voltage storage means; second circuitry means connecting said second voltage storage means to said first circuitry means and across said first voltage storage means as well as to said control element of said electronic signal switching means; third circuitry means including a unidirectional current conducting device connecting said signal rectifying means to said second circuitry means and across said second storage means whereby during the first quarter of one of said cycles said first and second voltage storage means each develop a first stored voltage and whereby during the second quarter of said cycle said first voltage storage means develops a second stored voltage, which has a particular polarity, in response to a partial discharge of said second voltage storage means thereby biasing said electronic signal switching means for conduction so that immediately following the passing of said cycle through said zero value said second stored voltage is measured from a positive going signal to provide a voltage bias at said control element to cause said electronic switching means to conduct.

2. A zero crossover switching circuit according to claim 1 wherein said circuitry means includes a diode connected across said first voltage storage means and poled to enable a discharge thereof prior to developing said stored voltage with said particular polarity.

3. A zero crossover switching circuit according to claim 1 wherein said circuitry means further includes an electrical resistor connected between said first voltage storage means and said control element in order to help bias said electronic switching means when said stored voltage of particular polarity is developed.

4. A zero crossover switching circuit according to claim 1 wherein there is further included a pulse transformer connected to said electronic switching means to provide an output pulse therefrom in response to said electronic switching means conducting.

* * * * *